(12) United States Patent
Cui et al.

(10) Patent No.: US 8,089,388 B2
(45) Date of Patent: Jan. 3, 2012

(54) FOLDING ANALOG-TO-DIGITAL CONVERTER

(75) Inventors: Zhiyuan Cui, Chungcheongbuk-do (KR); Injae Chung, Gyeonggi-do (KR); Namsoo Kim, Chungcheonbuk-do (KR)

(73) Assignee: LG Display Co., Ltd., Seoul (KR)

( * ) Notice: Subject to any disclaimer, the term of this patent is extended or adjusted under 35 U.S.C. 154(b) by 111 days.

(21) Appl. No.: 12/780,363

(22) Filed: May 14, 2010

(65) Prior Publication Data

US 2011/0181454 A1 Jul. 28, 2011

(30) Foreign Application Priority Data

Jan. 28, 2010 (KR) ........................ 10-2010-0007828

(51) Int. Cl.
*H03M 1/34* (2006.01)
(52) U.S. Cl. ......... 341/158; 341/155; 341/156; 341/161
(58) Field of Classification Search .................. 341/155, 341/156, 158, 161
See application file for complete search history.

(56) References Cited

U.S. PATENT DOCUMENTS 6,452,529 B1 * 9/2002 Li ................................. 341/156
6,950,051 B2 * 9/2005 Lee et al. ...................... 341/161

* cited by examiner

*Primary Examiner* — Jean Jeanglaude
(74) *Attorney, Agent, or Firm* — Morgan, Lewis & Bockius LLP

(57) ABSTRACT

A folding analog-to-digital converter (ADC) is disclosed. The folding ADC includes a reference voltage generating unit generating a plurality of reference voltages, a low power analog pre-processing unit including a plurality of folders, each of which compares a voltage level of an analog input signal with a corresponding reference voltage of the plurality of reference voltages to generate a pair of differential folded outputs, a comparison unit that compares outputs of the low power analog pre-processing unit to output a digital signal, and an encoding unit that converts an output of the comparison unit into a binary code signal.

16 Claims, 18 Drawing Sheets

FOLDING ANALOG-TO-DIGITAL CONVERTER

This application claims the benefit of Korean Patent Application No. 10-2010-0007828 filed on Jan. 28, 2010, the entire contents of which is incorporated herein by reference for all purposes as if fully set forth herein.

BACKGROUND OF THE INVENTION

1. Field of the Invention

Embodiments of the invention relate to a semiconductor device used in a communication element, a digital signal processing field, and an electronic circuit field, and more particularly to a folding analog-to-digital converter.

2. Discussion of the Related Art

A reason to convert an analog signal into a digital signal is to efficiently store, process, and regenerate a signal. With the development of digital technology, almost all information has been recently converted from an analog signal into a digital signal. For this, the analog signal has been converted into the digital signal using an analog-to-digital converter (ADC).

Examples of analog-to-digital converters having characteristics of a high speed and a low power include a flash analog-to-digital converter, a sub-range analog-to-digital converter, a pipeline analog-to-digital converter, and a folding and interpolating analog-to-digital converter.

The flash ADC having the fastest conversion speed among analog-to-digital converters has several defects because of a large number of function blocks and a high input capacity capacitor. To overcome the defects of the flash ADC, a flash ADC implemented by a folding and interpolating circuit technology was proposed. Further, a method for applying the folding and interpolating circuit technology to the sub-range ADC and the pipeline ADC each having a small number of function blocks has been studied. The folding and interpolating ADC was studied based on a bipolar junction transistor (BJT) circuit in an early stage research. In a recent study, as a complementary metal-oxide-semiconductor (CMOS) circuit technology has been recently developed, a CMOS folding and interpolating ADC has been developed.

The structure of the folding and interpolating ADC simultaneously has advantages of the flash ADC in which there is no delay while achieving a high speed, advantages of the sub-range ADC with a small circuit area and low power consumption, and advantages of the pipeline ADC. However, a large number of current sources are necessary in a folding circuit of the folding and interpolating ADC, and thus power consumption of the folding and interpolating ADC greatly increases. Accordingly, a study to reduce the power consumption of the folding and interpolating ADC are being carried out, but has not yet reached a satisfactory result.

FIG. 1 is a block diagram illustrating a basic structure of a folding analog-to-digital converter. As shown in FIGS. 1 and 2, a folding ADC folds an input signal Vin according to a predetermined folding ratio. Then, the folding ADC generates a coarse bit output from a portion of the folded input signal Vin using a coarse converter, and at the same time, generates a fine bit output from a remaining portion of the folded input signal Vin using a fine converter. The coarse converter obtains approximate information showing that a voltage level of the folded input signal belongs to any voltage range, and the fine converter obtains fine bit information using the folded input signal. A digital output is wholly obtained by a sum of the approximate information and the fine bit information. A folding input signal waveform of the folding ADC, as shown in FIG. 2, repeatedly shows an increase waveform and a decrease waveform. As an input of the coarse converter increases, the digital output of the coarse converter monotonously increases in the same manner as the flash ADC. The digital output of the fine converter increases by an interval of one coarse bit and then decreases. In other words, a digital output waveform of the fine converter repeatedly shows an increase waveform and a decrease waveform within an entire input range.

FIG. 3 is a block diagram illustrating a fine converter circuit structure of a folding analog-to-digital converter.

As shown in FIG. 3, a folding ADC 10 includes a reference voltage generating unit 20, an analog pre-processing unit 30, a comparison unit 40, and an encoding unit 50.

The reference voltage generating unit 20 has a plurality of resistors connected in series between a reference voltage source and a ground level voltage source. The reference voltage generating unit 20 divides a reference voltage according to each of resistance ratios to generate a plurality of reference voltages each a different value.

The analog pre-processing unit 30 includes a plurality of folder circuits, each of which performs a processing operation on the plurality of reference voltages generated by the reference voltage generating unit 20 and an analog input signal Vin.

The comparison unit 40 includes a plurality of comparison amplifier, each of which compares a pair of differential outputs received from the analog pre-processing unit 30. The encoding unit 50 converts a digital output signal received from the comparison unit 40 into a binary code to produce n-bit binary code.

As described above, the folding ADC 10 generally requires the reference voltage generating unit 20 having $2^n$ resistors, the analog pre-processing unit 30 having $2^n/s$ folder circuits, the comparison unit 40 having $2^n/s$ comparison amplifiers, etc., so as to obtain n-bit output signal, where "s" is a folding ratio. The folding ratio means the number of zero crossings of a folding signal or the number of pairs of differential signals in one folder circuit of the analog pre-processing unit 30. In the folding ADC 10, the $2^n/s$ folder circuits of the analog pre-processing unit 30 are knows as analog circuits and thus greatly increases power consumption of the folding ADC 10. Further, it is difficult to implement high integration of the folding ADC 10.

SUMMARY OF THE INVENTION

Embodiments of the invention provide a folding analog-to-digital converter capable of increasing accuracy of a conversion operation and achieving low power consumption.

In one aspect, there is a folding analog-to-digital converter comprising a reference voltage generating unit that generates a plurality of reference voltages, a low power analog pre-processing unit including a plurality of folders, each of which compares a voltage level of an analog input signal with a corresponding reference voltage of the plurality of reference voltages to generate a pair of differential folded outputs, a comparison unit that compares outputs of the low power analog pre-processing unit to output a digital signal, and an encoding unit that converts an output of the comparison unit into a binary code signal, wherein each of the plurality of folders of the low power analog pre-processing unit includes a plurality of folding units, each of which compares the voltage level of the analog input signal with a corresponding reference voltage of the plurality of reference voltages, wherein the plurality of folding units are cascade-connected to one another, wherein when one of the plurality of folding units receives an output of a previous folding unit of the one folding unit, a current source of the one folding unit is driven so that a current source of a next folding unit of the one folding unit is driven in an operation mode, wherein when the voltage level of the analog input signal is less than the reference voltage, the current source of the one folding unit is driven so that the current source of the next folding unit is converted into a sleep mode.

Each of the plurality of folders includes a reference current source and a pair of reference differential transistors that are connected to the reference current source and output a pair of differential signals. The plurality of folding units are cascade-connected to the pair of reference differential transistors and generate the pair of differential folded outputs.

When the voltage level of the analog input signal is less than the reference voltage, a current source of an i-th folding unit reduces an output current of the i-th folding unit and allows current sources of folding units in stages equal to or greater than an (i+1)th folding unit to be converted into a sleep mode, where i is a positive integer. Each of the folding units in the sleep mode does not generate an output.

When the voltage level of the analog input signal is equal to or greater than the reference voltage, the current source of the i-th folding unit increases an output current of the i-th folding unit and allows the current source of the (i+1)th folding unit to be driven in an operation mode. Each of the folding units in the operation mode generates an output for driving a current source of a next folding unit.

The i-th folding unit includes an Zi input terminal connected to an Y(i−1) output terminal of an (i−1)th folding unit and one of the pair of reference differential transistors, an Xi output terminal connected to a load of an output terminal of the i-th folding unit, an Yi output terminal connected to an Z(i+1) input terminal of the (i+1)th folding unit, a reference voltage input terminal receiving the reference voltage, and an analog voltage input terminal receiving the analog input signal.

The i-th folding unit further includes a current source that is driven according to a current supplied to the Zi input terminal and a pair of differential transistors connected to the current source.

The current source of the i-th folding unit includes two current mirror circuits connected between the Zi input terminal and the pair of differential transistors.

In another aspect, there is a folding analog-to-digital converter comprising a coarse converter for converting an analog input signal into most significant bit and a fine converter for converting the analog input signal into least significant bit.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
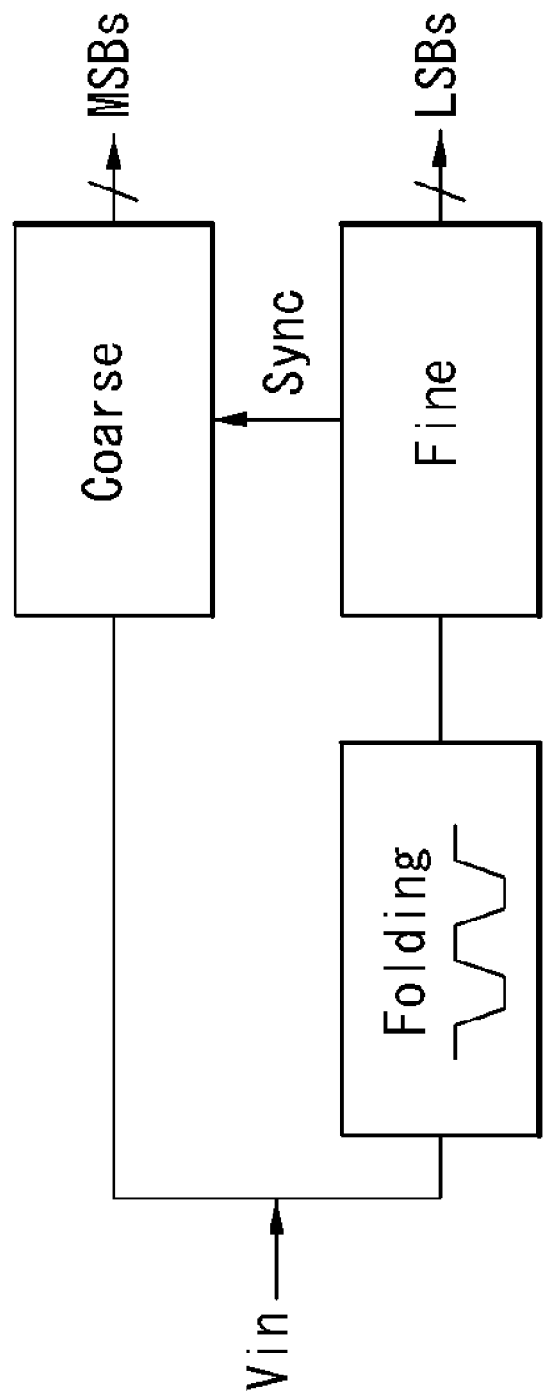
FIG. 1 is a block diagram illustrating a basic structure of a folding analog-to-digital converter.
Figure 2:
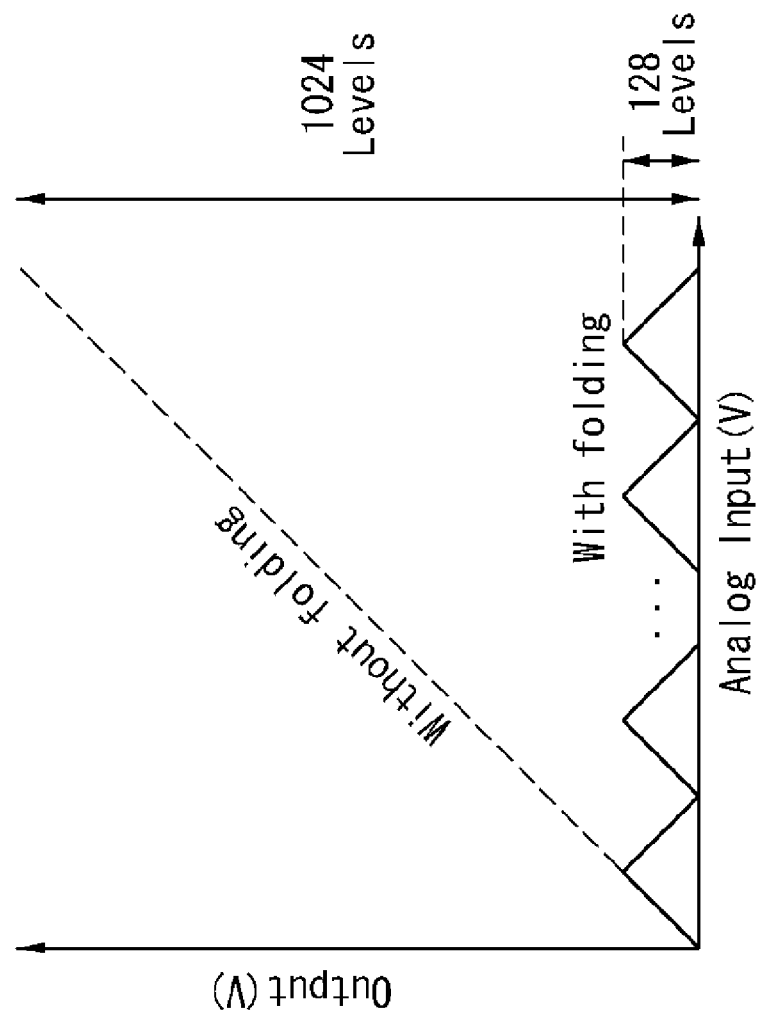
FIG. 2 is a graph illustrating a transfer characteristic of a folding structure in a folding analog-to-digital converter.
Figure 3:
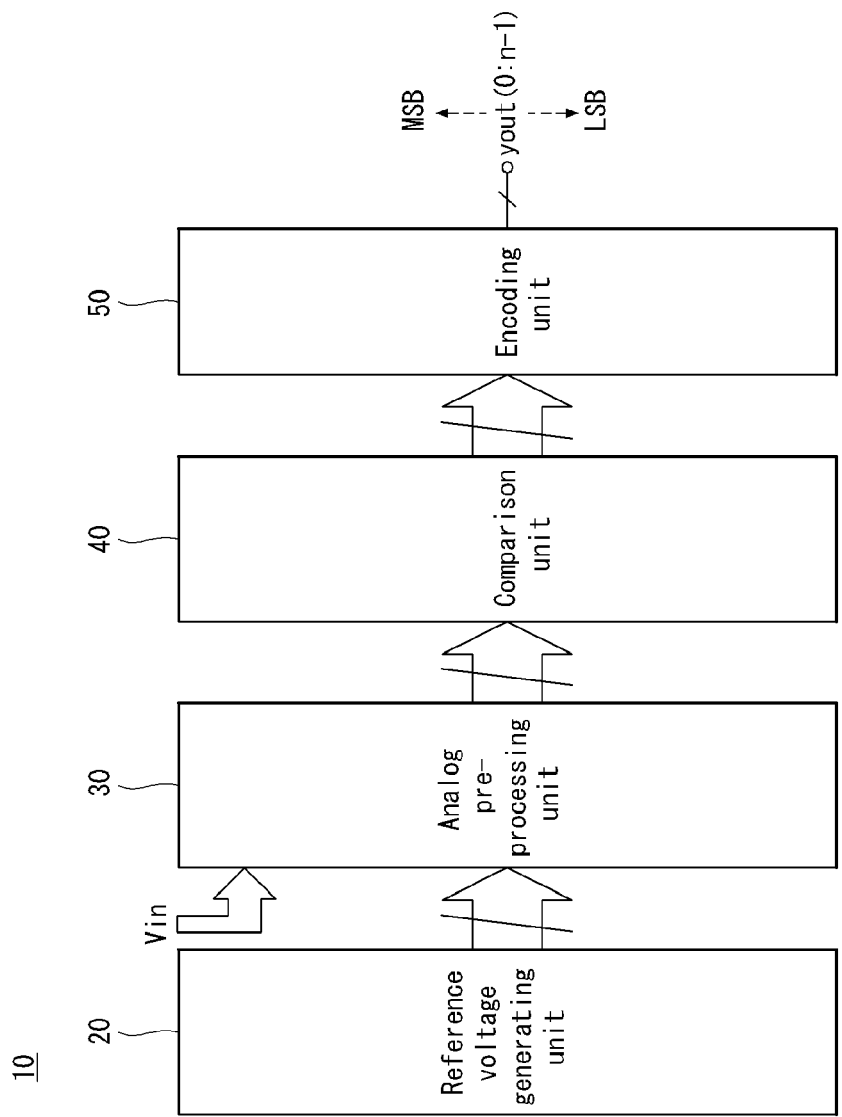
FIG. 3 is a block diagram illustrating a fine converter circuit structure of a folding analog-to-digital converter.

The invention will be described more fully hereinafter with reference to the accompanying drawings, in which example embodiments of the inventions are shown. This invention may, however, be embodied in many different forms and should not be construed as limited to the embodiments set forth herein. Like reference numerals designate like elements throughout the specification. In the following description, if it is decided that the detailed description of known function or configuration related to the invention makes the subject matter of the invention unclear, the detailed description is omitted.

Names of elements used in the following description are selected in consideration of facility of specification preparation. Thus, the names of the elements may be different from names of elements used in a real product.

Figure 4:
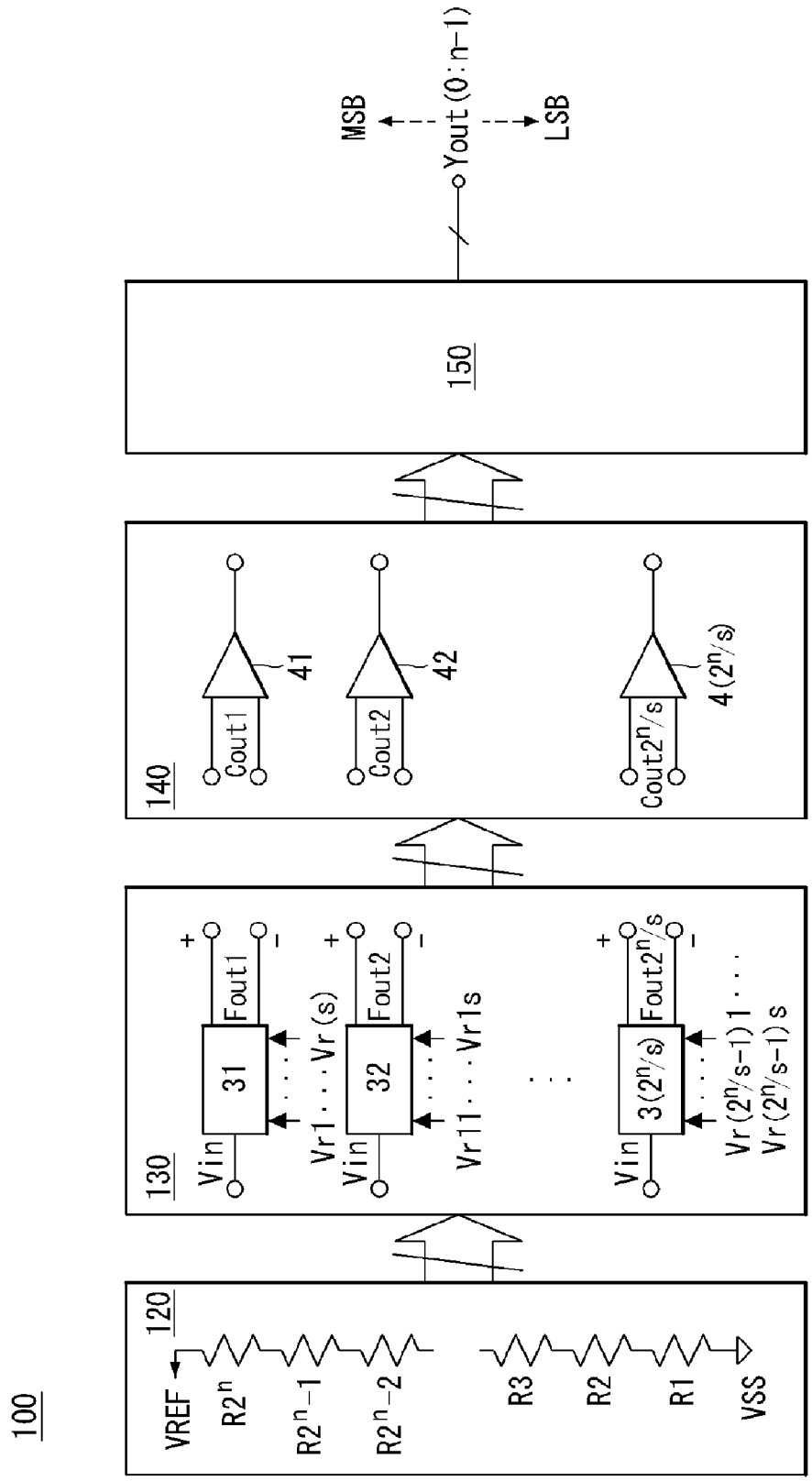
FIG. 4 is a block diagram illustrating a folding analog-to-digital converter according to an embodiment of the invention.
Figure 5:
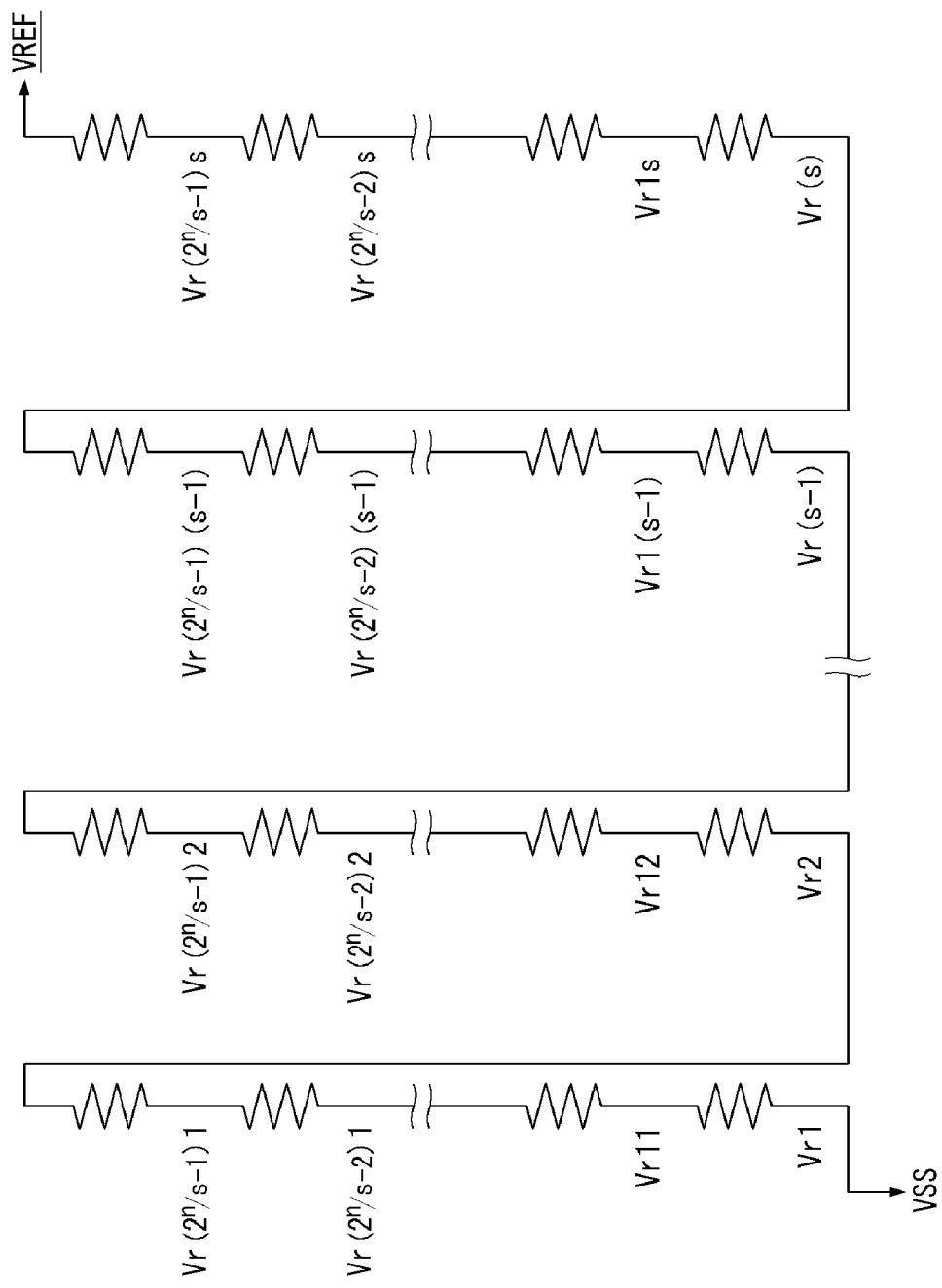
FIG. 5 is a circuit diagram illustrating a resistor string of a reference voltage generating unit.

FIG. 4 is a block diagram illustrating a folding analog-to-digital converter according to an embodiment of the invention. FIG. 5 is a circuit diagram illustrating a resistor string of a reference voltage generating unit.

As shown in FIGS. 4 and 5, a folding analog-to-digital converter (ADC) 100 according to an embodiment of the invention includes a reference voltage generating unit 120, a low power analog pre-processing unit 130, a comparison unit 140, and an encoding unit 150.

The reference voltage generating unit 120, as shown in FIG. 5, divides a reference voltage using a resistor string to generate a plurality of reference voltages Vr1 to Vr($2^n$/s−1)s to be input to a folder of the low power analog pre-processing unit 130. The resistor string of the reference voltage generating unit 120 includes a plurality of equivalent resistors R1 to R($2^n$/s−1)s] connected in series between a reference voltage source VREF and a low potential voltage sources VSS. More specifically, the reference voltage generating unit 120 divides the reference voltage according to a division ratio of each of the equivalent resistors R1 to R($2^n$/s−1)s] to generate the plurality of reference voltages Vr1 to Vr($2^n$/s−1)s.

The low power analog pre-processing unit 130 includes a plurality of folders 31 to 3($2^n$/s), each of which compares an analog input signal Vin with the corresponding reference voltage to generate folded output signals FOut1 to FOut$2^n$/S, where "s" indicates a folding ratio and means the number of zero crossings of a folding signal output from the low power analog pre-processing unit 130 or the number of pairs of differential signals in one folder of the low power analog pre-processing unit 130. Each of the folders 31 to 3($2^n$/s) includes a plurality of cascade-connected current trigger type folding units (hereinafter, referred to as "folding units") each having a plurality of current sources. The current sources of each of the folding units are selectively driven in response to the analog input signal Vin and the reference voltage to thereby greatly reduce current consumption. For example, when a voltage level of the analog input signal Vin is greater than a second reference voltage Vr2 and is less than a third reference voltage Vr3, only three folding units are driven in an operation mode and other folding units remain in a sleep mode. Current does not flow in the other folding units remaining in the sleep mode. Thus, the current sources of each folding unit are driven in the operation mode when the voltage level of the analog input signal Vin is equal to or greater than the reference voltage, and the current sources of each folding unit are driven in the sleep mode when the voltage level of the analog input signal Vin is less than the reference voltage.

The comparison unit 140 includes a plurality of amplifiers 41 to 4($2^n$/s) that compare output signals received from the low power analog pre-processing unit 130 to output digital signals. The encoding unit 150 converts digital output signals Cout1 to Cout$2^n$/s of the comparison unit 140 into a binary code to produce n-bit binary code Yout(0:n−1). The comparison unit 140 and the encoding unit 150 may be implemented by a circuit configuration shown in FIGS. 12 to 15.

Figure 6:
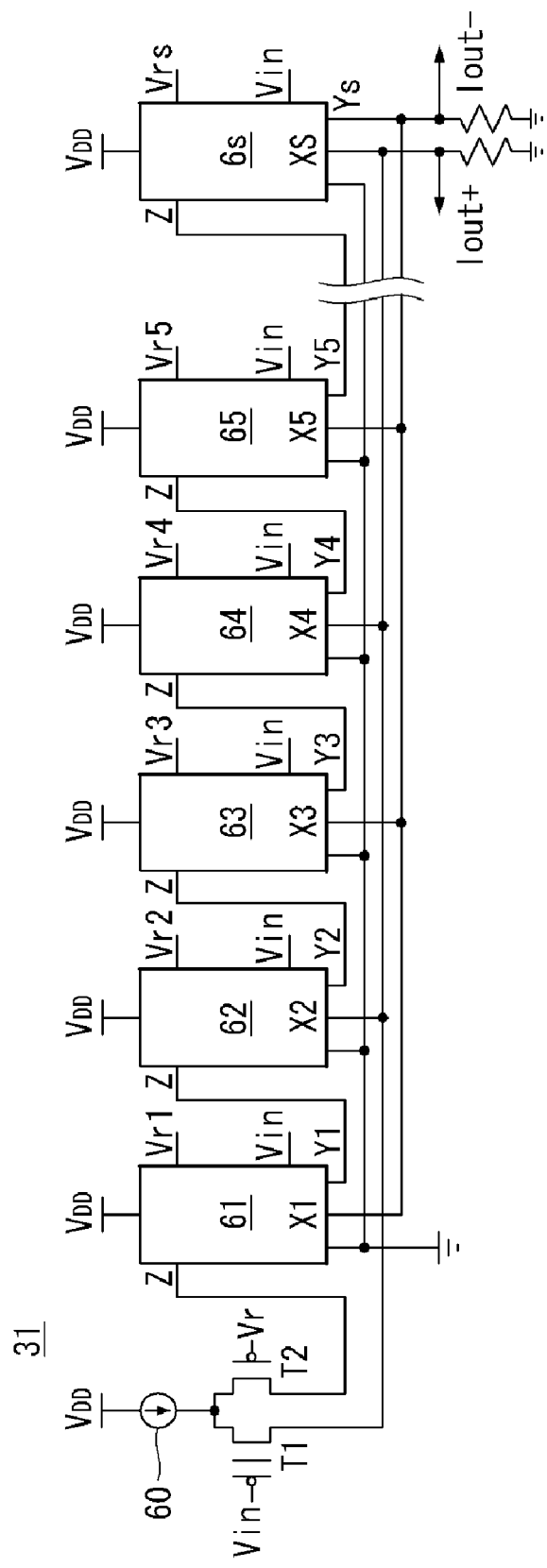
FIGS. 6 and 7 are circuit diagrams illustrating in detail an example of a first folder of a low power analog pre-processing unit according to an embodiment of the invention.
Figure 7:
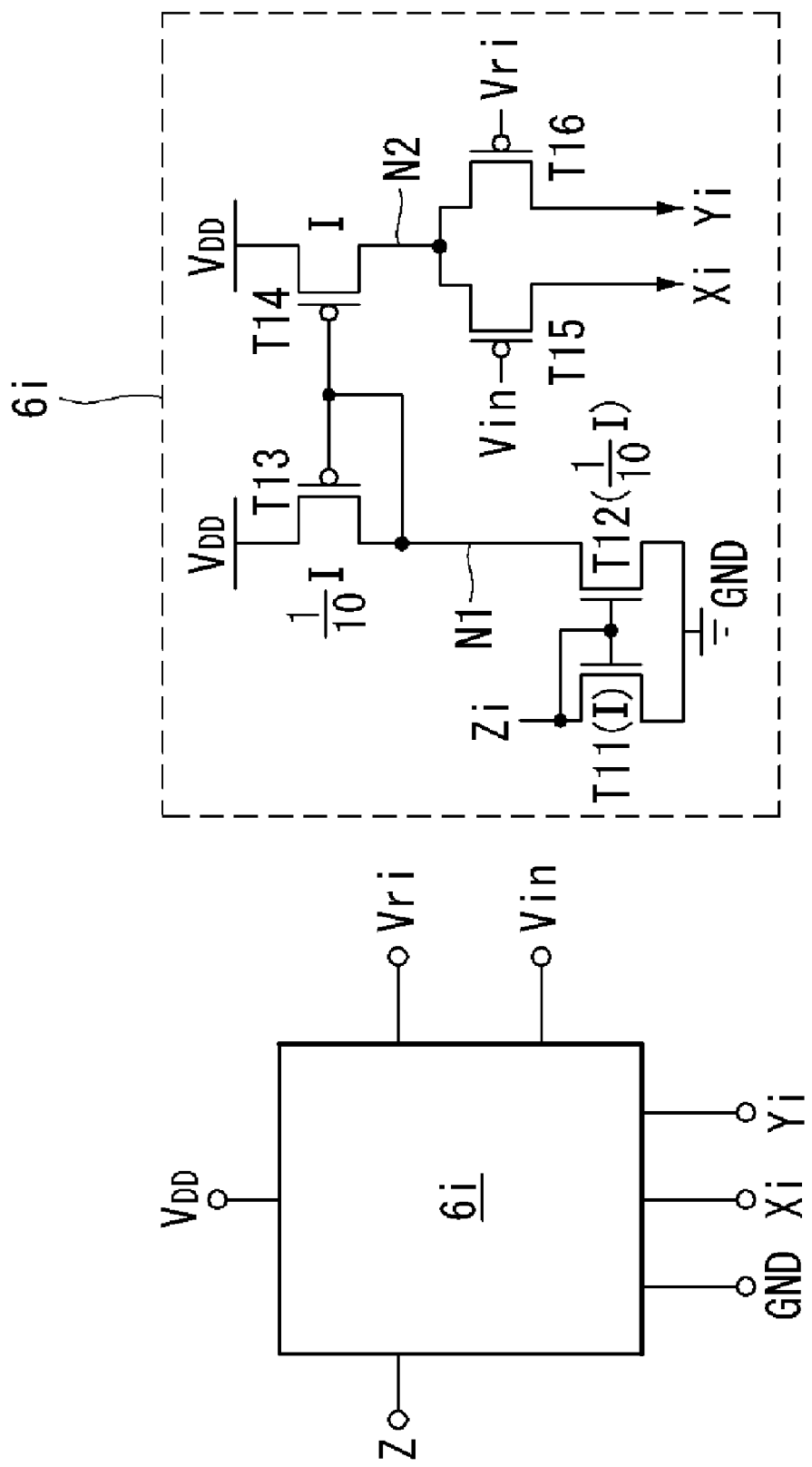

FIGS. 6 and 7 are circuit diagrams illustrating in detail an example of a first folder 31 of the low power analog pre-processing unit 130 according to the embodiment of the invention. Circuit configurations and operations of the other folders 32 to 3($2^n$/s) of the low power analog pre-processing unit 130 are substantially the same as the first folder 31 except the reference voltage.

As shown in FIGS. 6 and 7, the first folder 31 includes a current source 60, a pair of reference differential transistors T1 and T2, s folding units 61 to 6s, and the like. The current source 60 is connected between a high potential power voltage source VDD and the pair of reference differential transistors T1 and T2 and receives a high potential power voltage VDD to generate a constant current.

The pair of reference differential transistors T1 and T2 include the first transistor T1 adjusting a current amount depending on the analog input signal Vin and the second transistor T2 adjusting a current amount depending on a reference voltage Vr. In the first transistor T1, the analog input signal Vin is applied to a gate electrode, a source electrode is connected to the constant current source 60, and a drain electrode is connected to Xi output terminals and pull-down resistors of even-numbered folding units 62, 64, . . . , and 6s. In the second transistor T2, the reference voltage Vr is applied to a gate electrode, a source electrode is connected to the constant current source 60, and a drain electrode is connected to a Z output terminal of the first folding unit 61. The reference voltage Vr applied to the gate electrode of the second transistor T2 is less than a first reference voltage Vr1 applied to the first folding unit 61 and is produced by a separate voltage source. The first and second transistors T1 and T2 may be implemented as a p-type metal oxide semiconductor field effect transistor (MOSFET).

An i-th folding unit 6i includes a Z input terminal, an Xi output terminal, an Yi output terminal, a ground level voltage input terminal, a reference voltage input terminal, and an analog voltage input terminal, where "i" is a positive integer. A Z input terminal of the first folding unit 61 is connected to the drain electrode of the second transistor T2. The Z input terminal of the i-th folding unit 6i of a stage equal to or greater than the second folding unit 62 is connected to an Yi output terminal of an (i−1)th folding unit 6(i−1). Xi input terminals X1, X3, . . . , and Xs−1 of odd-numbered folding units 61, 63, . . . , and 6s−1 are connected to one another. Xi input terminals X2, X4, . . . , and Xs of even-numbered folding units 62, 64, . . . , and 6s are connected to one another and are connected to the drain electrode of the first transistor T1.

The i-th folding unit 6i is implemented by a current source, that is driven depending on current supplied to the Z input terminal of the i-th folding unit 6i, and a current trigger type folding circuit including a pair of differential transistors, etc. The current source of the i-th folding unit 6i is implemented by a current source circuit in which first and second current mirror circuits are connected to each other.

The first current mirror circuit includes first and second transistors T11 and T12. In the first transistor T11, a source electrode and a gate electrode are connected to the Z input terminal of the i-th folding unit 6i, and a drain electrode is connected to a ground level voltage source GND. In the second transistor T12, a gate electrode is connected to the gate electrode of the first transistor T11, a source electrode is connected to the second current mirror circuit, and a drain electrode is connected to the ground level voltage source GND. When current is supplied to the first transistor T11 through the Z input terminal of the i-th folding unit 6i, the current flows in the second transistor T12. Channel ratios of the first and second transistors T11 and T12 are determined so that when current corresponding to "I" flows in the first transistor T11, current corresponding to about "I/10" can flow in the second transistor T12. Hence, current consumption is reduced. The first and second transistors T11 and T12 may be implemented as an n-type MOSFET.

The second current mirror circuit is driven when the current flows in the first current mirror, and thus supplies current to a pair of differential transistors T15 and T16. The second current mirror circuit includes third and fourth transistors T13 and T14. A drain electrode and a gate electrode of the third transistor T13 are connected to the source electrode of the second transistor T12 via a first node N1, and the high potential power voltage VDD is supplied to a source electrode of the third transistor T13. In the fourth transistor T14, a gate electrode is connected to the gate electrode of the third transistor t13, a drain electrode is connected to the pair of differential transistors T15 and T16 via a second node N2, and the high potential power voltage VDD is supplied to a source electrode. When the current flows in the first node N1 by a drive of the first current mirror circuit, the current flows in the third and fourth transistors T13 and T14. Channel ratios of the third and fourth transistors T13 and T14 are determined so that when current corresponding to "I/10" flows in the third transistor T13, current corresponding to about "I" can flow in the fourth transistor T14. The third and fourth transistors T13 and T14 may be implemented as a p-type MOSFET.

The pair of differential transistors T15 and T16 compare a voltage of the current received from the second current mirror circuit with the analog input signal Vin and the reference voltage Vri to generate a pair of differential outputs Xi and Yi. The pair of differential transistors T15 and T16 include fifth and sixth transistors T15 and T16. The fifth transistor T15 adjusts a current amount between the second node N2 and the Xi output terminal of the i-th folding unit 6i depending on the analog input signal Vin. The analog input signal Vin is applied to a gate electrode of the fifth transistor T15, a source electrode of the fifth transistor T15 is connected to the drain electrode of the fourth transistor T14 via the second node N2, and a drain electrode of the fifth transistor T15 is connected to the Xi output terminal of the i-th folding unit 6i. The sixth transistor T16 adjusts a current amount between the second node N2 and the Yi output terminal of the i-th folding unit 6i depending on the reference voltage Vri. The reference voltage Vri is applied to a gate electrode of the sixth transistor T16, a source electrode of the sixth transistor T16 is connected to the drain electrode of the fourth transistor T14 via the second node N2, and a drain electrode of the sixth transistor T16 is connected to the Yi output terminal of the i-th folding unit 6i. The fifth and sixth transistors T15 and T16 may be implemented as a p-type MOSFET.

When current is supplied to the Z input terminal of the i-th folding unit 6i, the current corresponding to about "I/10" flows in the first node N1 by a drive of the first current mirror circuit, and at the same time, the current corresponding to about "I" flows the second node N2. When the voltage level of the analog input signal Vin is less than the reference voltage Vri, a current amount between the source electrode and the drain electrode of the fifth transistor T15 increases, but a current amount between the source electrode and the drain electrode of the sixth transistor T16 decreases. On the other hand, when the voltage level of the analog input signal Vin is greater than the reference voltage Vri, a current amount between the source electrode and the drain electrode of the sixth transistor T16 increases, but a current amount between the source electrode and the drain electrode of the fifth transistor T15 decreases.

The i-th folding unit 6i drives the first and second current mirror circuits of the i-th folding unit 6i depending on the voltage level of the analog input signal Vin received from an (i−1)th folding unit 6(i−1) to operate in an operation mode. Then, the i-th folding unit 6i transfers the current to an (i+1)th folding unit 6(i+1) through the Yi output terminal If the i-th folding unit 6i does not receive the analog input signal Vin from the (i−1)th folding unit 6(i−1), the i-th folding unit 6i is converted into a sleep mode and thus does not generate current.

When the voltage level of the analog input signal Vin is less than the first reference voltage Vr1, current is transferred to a pull-down resistor (or a load) of an output terminal of the first folding unit 61 through an X1 output terminal of the first folding unit 61, and current does not flow in an Y1 output terminal of the first folding unit 61. In this case, first and second current mirror circuits of each of the folding units 62 to 6s in stages equal to or greater than the second folding unit 62 are converted into a sleep mode and do not generate current.

Figure 11:
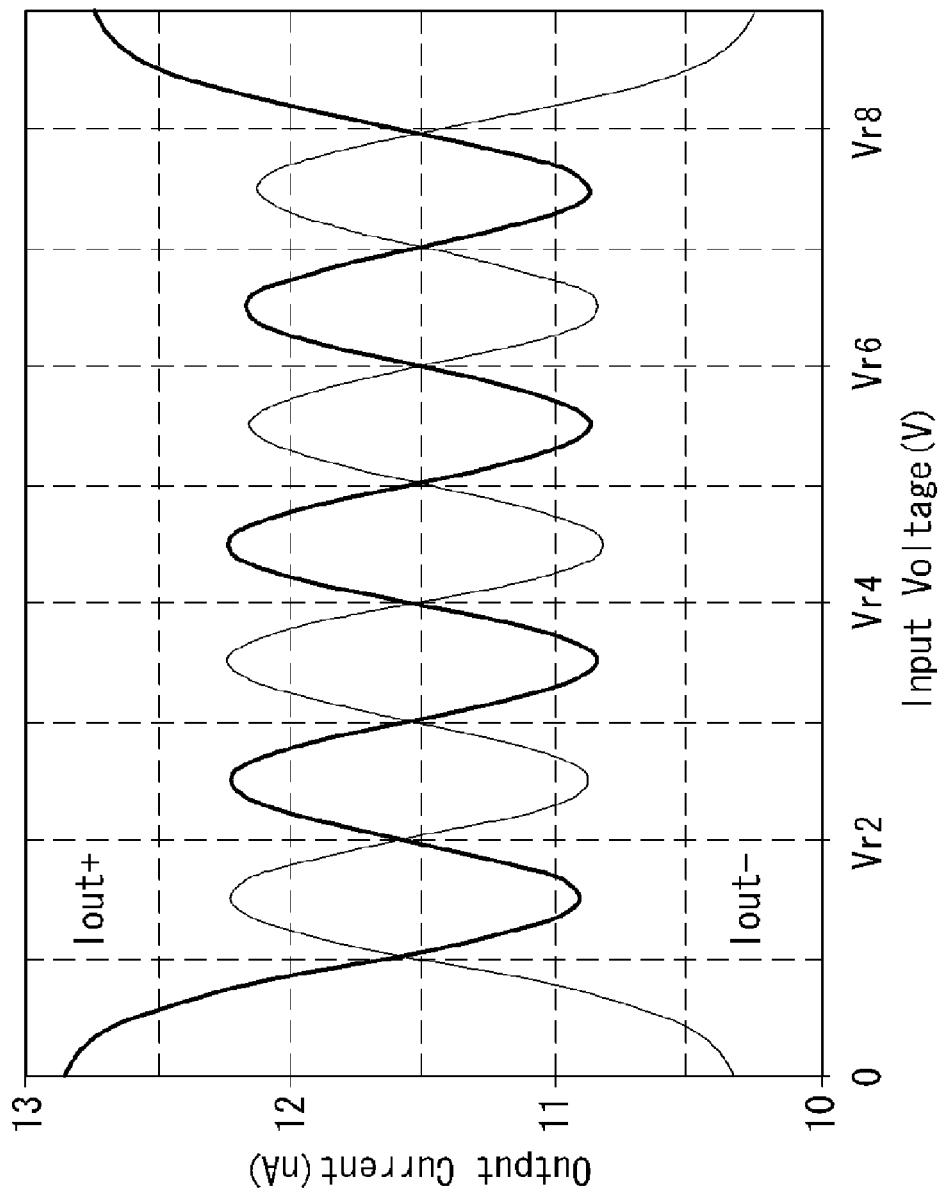
FIG. 11 is a waveform diagram illustrating a pair of differential outputs output from a folder when a folding ratio is 8.

When the voltage level of the analog input signal Vin is equal to or greater than the first reference voltage Vr1 as the voltage level of the analog input signal Vin continuously increases, a current amount of the Y1 output terminal of the first folding unit 61 increases. Hence, first and second current mirror circuits of the second folding unit 62 are converted into an operation mode, and current flows in an Y2 output terminal of the second folding unit 62. When the voltage level of the analog input signal Vin increases to full scale, each of the folding units 61 to 6s repeatedly performs the above-described operation of the operation mode and sequentially transfers current to the folding unit of a next stage. Thus, each of the folding units 61 to 6s outputs a folding signal that forms zero crossings of the reference voltage, depending on the voltage level of the analog input signal Vin as shown in FIG. 11.

The embodiment of the invention drives the folding units 61 to 6s depending on the voltage level of the analog input signal Vin in the operation mode or the sleep mode to thereby reduce the power consumption of the folding ADC 100.

The folders 31 to 3($2^n$/s) of the low power analog pre-processing unit 130 are not limited to the circuit configuration and the operation illustrated in FIGS. 6 and 7. For example, the folders 31 to 3($2^n$/s) may have a circuit configuration and an operation illustrated in FIGS. 8 and 9.

Figure 8:
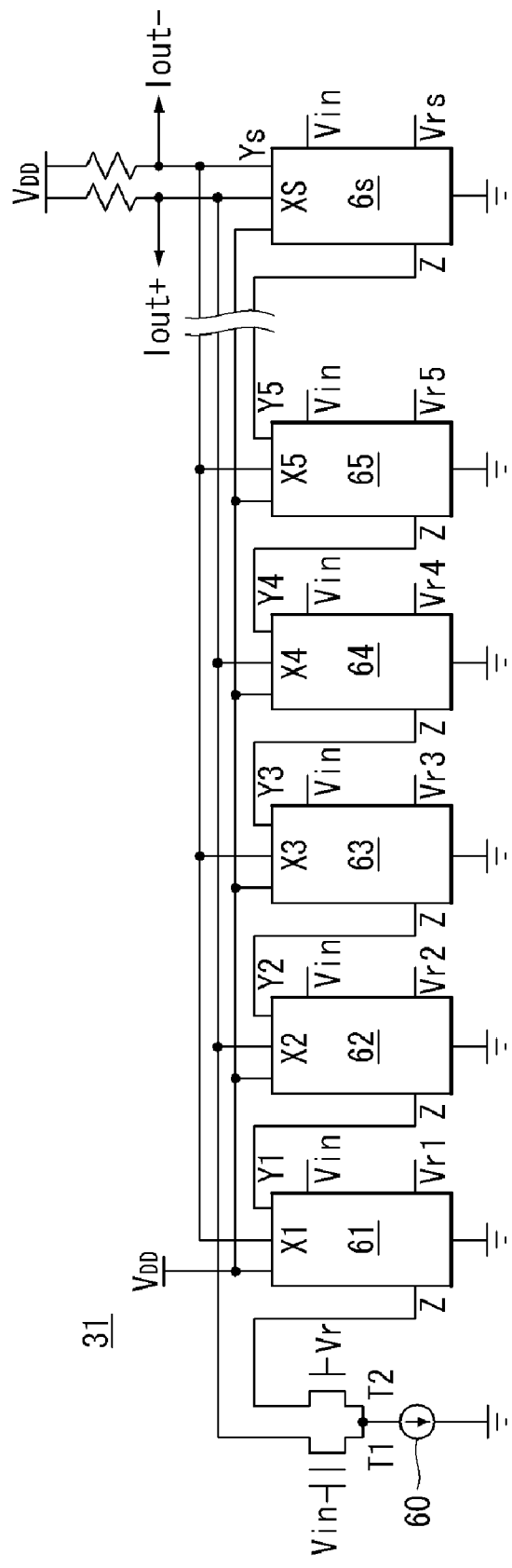
FIGS. 8 and 9 are circuit diagrams illustrating in detail another example of a first folder of a low power analog pre-processing unit according to an embodiment of the invention.
Figure 9:
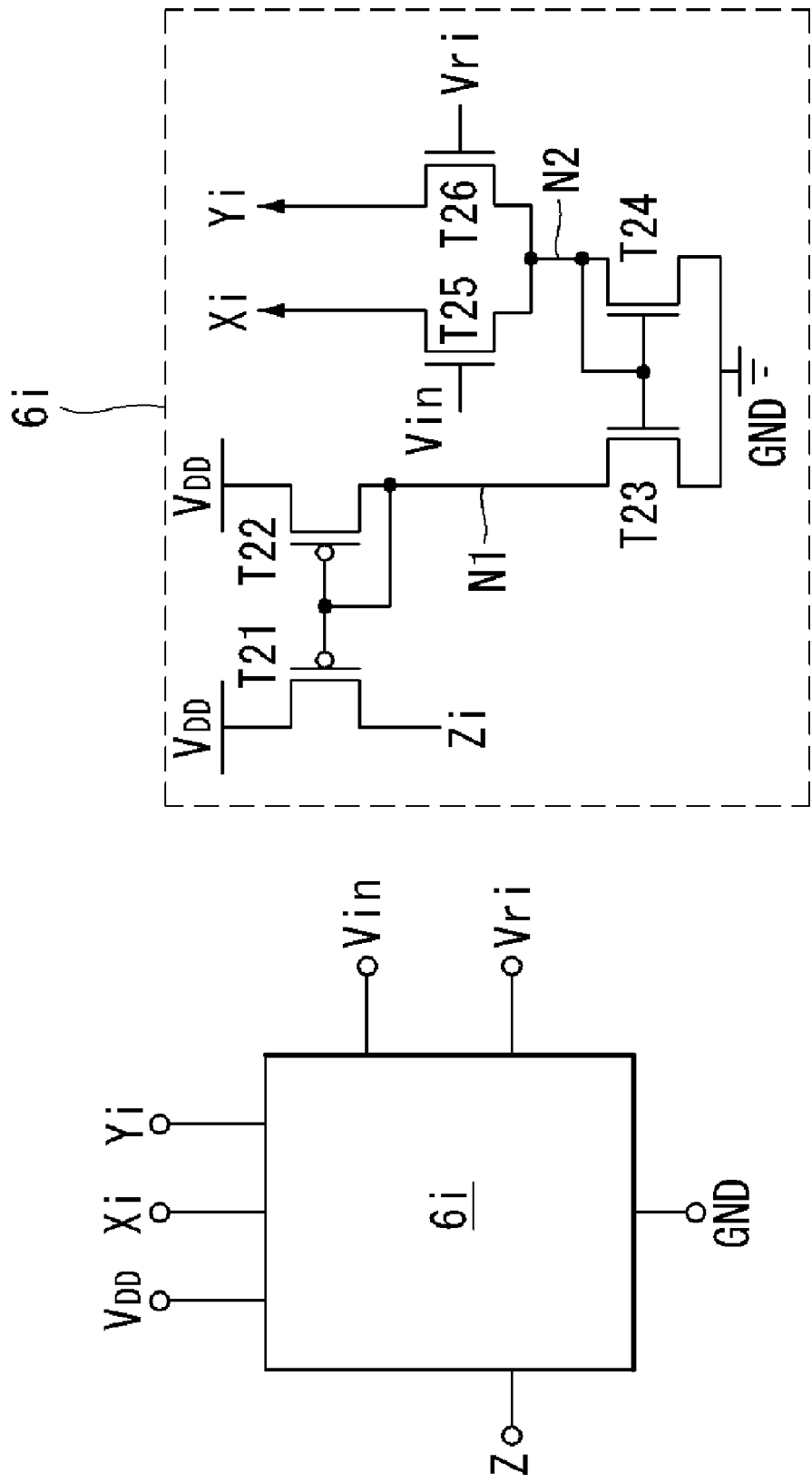

FIGS. 8 and 9 are circuit diagrams illustrating in detail another example of a first folder 31 of the low power analog pre-processing unit 130 according to the embodiment of the invention.

As shown in FIGS. 8 and 9, the first folder 31 includes a current source 60, a pair of reference differential transistors T1 and T2, s folding units 61 to 6s, and the like. The current source 60 is connected between the ground level voltage source GND and the pair of reference differential transistors T1 and T2.

The pair of reference differential transistors T1 and T2 include the first transistor T1 adjusting a current amount depending on the analog input signal Vin and the second transistor T2 adjusting a current amount depending on a reference voltage Vr. In FIGS. 8 and 9, the first and second transistors T1 and T2 are implemented as an n-type MOSFET. In the first transistor T1, the analog input signal Vin is applied to a gate electrode, a source electrode is connected to the current source 60, and a drain electrode is connected to Xi output terminals and pull-down resistors of even-numbered folding units 62, 64, ..., and 6s. In the second transistor T2, the reference voltage Vr is applied to a gate electrode, a source electrode is connected to the current source 60, and a drain electrode is connected to a Z output terminal of the first folding unit 61. The reference voltage Vr applied to the gate electrode of the second transistor T2 is less than a first reference voltage Vr1 applied to the first folding unit 61 and is produced by a separate voltage source.

An i-th folding unit 6i includes a Z input terminal, an Xi output terminal, an Yi output terminal, a ground level voltage input terminal, a reference voltage input terminal, and an analog voltage input terminal, where "i" is a positive integer. A Z input terminal of the first folding unit 61 is connected to the drain electrode of the second transistor T2. The Z input terminal of the i-th folding unit 6i in a stage equal to or greater than the second folding unit 62 is connected to an Yi output terminal of an (i−1)th folding unit 6(i−1). Xi input terminals X1, X3, ..., and Xs−1 of odd-numbered folding units 61, 63, ..., and 6s−1 are connected to one another. Xi input terminals X2, X4, ..., and Xs of even-numbered folding units 62, 64, ..., and 6s are connected to one another and are connected to the drain electrode of the first transistor T1.

The i-th folding unit 6i is implemented by a current source, that is driven depending on current supplied to the Z input terminal of the i-th folding unit 6i, and a current trigger type folding circuit including a pair of differential transistors, etc. The current source of the i-th folding unit 6i is implemented by a current source circuit in which first and second current mirror circuits are connected to each other.

The first current mirror circuit includes first and second transistors T21 and T22. In the first current mirror circuit, the first and second transistors T21 and T22 are implemented as a p-type MOSFET. In the first transistor T21, a source electrode is connected to the Z input terminal of the i-th folding unit 6i, a drain electrode is connected to the high potential power voltage source VDD, and a gate electrode is connected to a gate electrode of the second transistor T22. In the second transistor T22, the gate electrode and a source electrode are connected to the gate electrode of the first transistor T21 and a first node N1, and a drain electrode is connected to the high potential power voltage source VDD. When current is supplied to the first transistor T21 through the Z input terminal of the i-th folding unit 6i, the current flows in the second transistor T22. Channel ratios of the first and second transistors T21 and T22 are determined so that when current corresponding to "I" flows in the first transistor T21, current corresponding to about "I/10" can flow in the second transistor T22. Hence, current consumption is reduced.

The second current mirror circuit is driven when the current flows in the first current mirror, and thus supplies current to a pair of differential transistors T25 and T26. The second current mirror circuit includes third and fourth transistors T23 and T24. In the second current mirror circuit, the third and fourth transistors T23 and T24 are implemented as an n-type MOSFET. A drain electrode of the third transistor T23 is connected to the source electrode and the gate electrode of the second transistor T22 via the first node N1, and a source electrode of the third transistor T23 is connected to the ground level voltage source GND. A gate electrode and a drain electrode of the fourth transistor T24 are connected to the gate electrode of the third transistor t23 and are connected to the pair of differential transistors T25 and T26 via a second node N2, and a source electrode of the fourth transistor T24 is connected to the ground level voltage source GND. When the current flows in the first node N1 by a drive of the first current mirror circuit, the current flows in the third and fourth transistors T23 and T24. Channel ratios of the third and fourth transistors T23 and T24 are determined so that when current corresponding to "I/10" flows in the third transistor T23, current corresponding to about "I" can flow in the fourth transistor T24.

The pair of differential transistors T25 and T26 compare a voltage of the current received from the second current mirror circuit with the analog input signal Vin and the reference voltage Vri to generate a pair of differential outputs Xi and Yi. The pair of differential transistors T25 and T26 include fifth and sixth transistors T25 and T26. The fifth and sixth transistors T25 and T26 are implemented as an n-type MOSFET. The fifth transistor T25 adjusts a current amount between the second node N2 and the Xi output terminal of the i-th folding unit 6i depending on the analog input signal Vin. The analog input signal Vin is applied to a gate electrode of the fifth transistor T25, a source electrode of the fifth transistor T25 is connected to the gate electrode and the drain electrode of the fourth transistor T24 via the second node N2, and a drain electrode of the fifth transistor T25 is connected to the Xi output terminal of the i-th folding unit 6i. The sixth transistor T26 adjusts a current amount between the second node N2 and the Yi output terminal of the i-th folding unit 6i depending on the reference voltage Vri. The reference voltage Vri is applied to a gate electrode of the sixth transistor T26, a source electrode of the sixth transistor T26 is connected to the drain electrode of the fourth transistor T24 via the second node N2, and a drain electrode of the sixth transistor T26 is connected to the Yi output terminal of the i-th folding unit 6i.

The operation of the first folder 31 illustrated in FIGS. 8 and 9 is substantially the same as the first folder 31 illustrated in FIGS. 6 and 7. For example, when the voltage level of the analog input signal Vin is less than the first reference voltage Vr1, current is transferred to a pull-up resistor (or a load) of an output terminal of the first folding unit 61 through an X1 output terminal of the first folding unit 61, and current does not flow in an Y1 output terminal of the first folding unit 61. In this case, first and second current mirror circuits of each of the folding units 62 to 6s in stages equal to or greater than the second folding unit 62 are converted into a sleep mode and do not generate current.

When the voltage level of the analog input signal Vin is equal to or greater than the first reference voltage Vr1 as the voltage level of the analog input signal Vin continuously increases, a current amount of the Y1 output terminal of the first folding unit 61 increases. Hence, first and second current mirror circuits of the second folding unit 62 are converted into an operation mode, and current flows in an Y2 output terminal of the second folding unit 62. When the voltage level of the analog input signal Vin increases to full scale, each of the folding units 61 to 6s repeatedly performs the above-described operation of the operation mode and sequentially transfers current to the folding unit of a next stage. Thus, each of the folding units 61 to 6s outputs a folding signal that forms zero crossings of the reference voltage depending on the voltage level of the analog input signal Vin as shown in FIG. 11.

Figure 10:
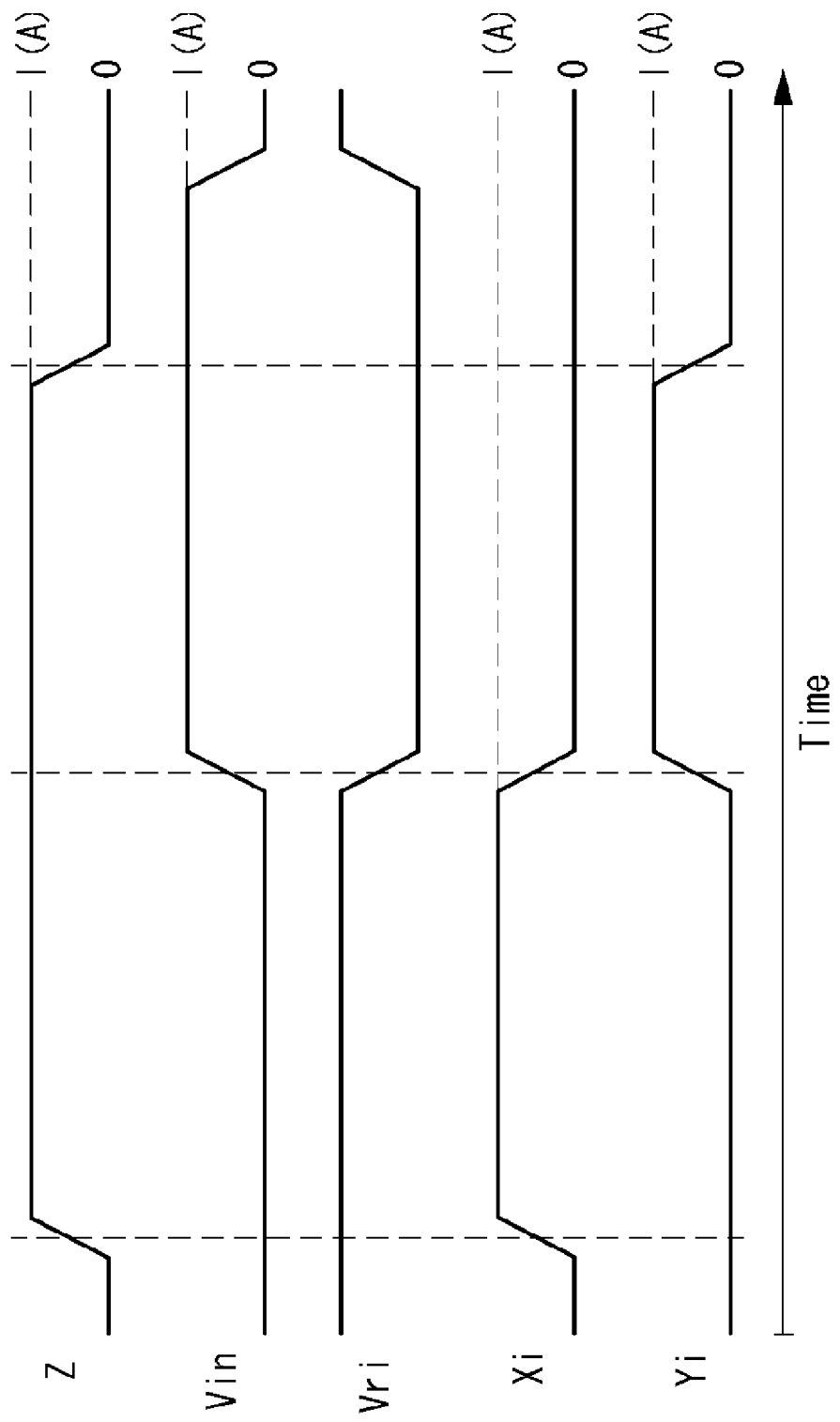
FIG. 10 is a timing diagram illustrating an example of input and output waveforms of an i-th folding unit.

FIG. 10 is a timing diagram illustrating an example of input and output waveforms of the i-th folding unit 6i.

As shown in FIG. 10, when the voltage level of the analog input signal Vin is equal to or greater than the reference voltage Vri, the i-th folding unit 6i supplies current to the (i+1)th folding unit 6(i+1) through the Yi output terminal of the i-th folding unit 6i, and the (i+1)th folding unit 6(i+1) is converted into an operation mode. Further, when the voltage level of the analog input signal Vin is less than the reference voltage Vri, the i-th folding unit 6i reduces an current amount of the Yi output terminal of the i-th folding unit 6i, and the folding units in stages equal to or greater than the (i+1)th folding unit 6(i+1) are converted into a sleep mode and do not generate current.

Figure 12:
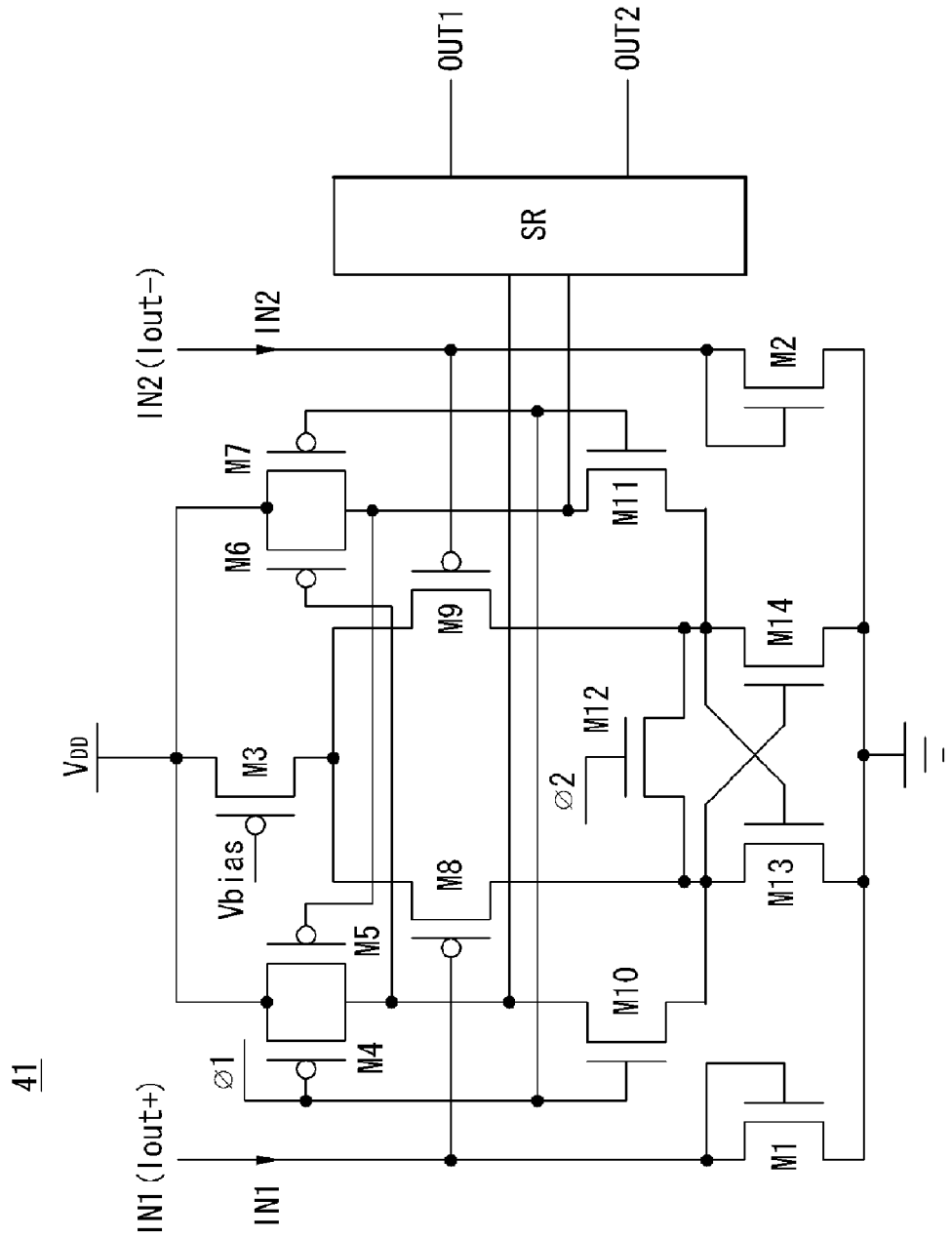
FIG. 12 is a circuit diagram illustrating a circuit configuration of a first comparison amplifier of a comparison unit.
Figure 13:
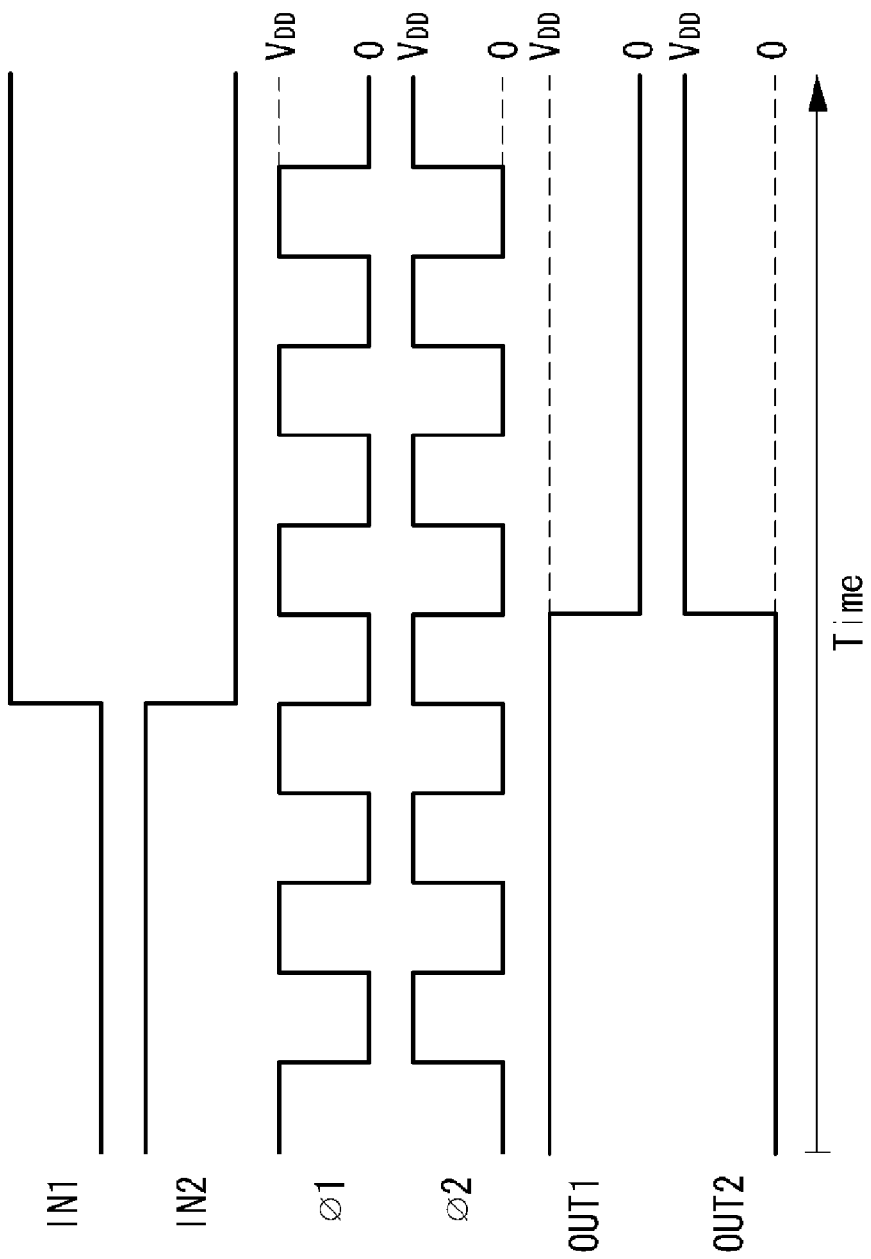
FIG. 13 is a waveform diagram illustrating input and output waveforms of a first comparison amplifier.

FIG. 12 is a circuit diagram illustrating a circuit configuration of a first comparison amplifier 41 of the comparison unit 140 shown in FIG. 4. Circuit configurations and operations of other comparison amplifiers 42 to 4(2$^n$/s) of the comparison unit 140 are substantially the same as the first comparison amplifier 41. FIG. 13 is a waveform diagram illustrating input and output waveforms of the first comparison amplifier 41.

As shown in FIG. 12, the first comparison amplifier 41 receives a pair of differential outputs Iout+ and Iout− from the first folder 31 to output a digital signal.

The first comparison amplifier 41 includes a pair of differential input transistors M8 and M9, flip-flops M3 to M7 and M10 to M14, and an S-R latch circuit SR. In FIG. 12, first and second transistors M1 and M2 are connected to each other in a diode form and serve as a pull-down resistor. The 1st, 2nd and 10th to 14th transistors M1, M2 and M10 to M14 may be implemented as an n-type MOSFET, and the 3rd to 9th transistors M3 to M9 may be implemented as a p-type MOSFET. A first clock Φ1 is applied to gate electrodes of the 4th, 10th and 11th transistors M4, M10 and M11, and a second clock Φ2 is applied to a gate electrode of the 12th transistor M12. The first and second clocks Φ1 and Φ2 are generated as clocks that are out of phase. The first and second clocks Φ1 and Φ2 control the flip-flops M3 to M7 and M10 to 14 in a regeneration mode and a reset mode.

The pair of differential input transistors M8 and M9 amplify a pair of differential input signals IN1 and IN2 to supply the pair of differential input signals IN1 and IN2 to drain electrodes of the 13th and 14th transistors M13 and M14. When the second clock Φ2 is at a high logic level, the first comparison amplifier 41 operates in the reset mode. In the reset mode, the 12th transistor M12 is turned on because of the second clock Φ2 of the high logic level and thus allows drain voltages of the 13th and 14th transistors M13 and M14 to be equal to each other. As a result, first and second outputs Out1 and Out2 of the S-R latch circuit SR remain in a previous output state.

When the first clock Φ1 is at a high logic level, the first comparison amplifier 41 operates in the regeneration mode. In the regeneration mode, the 10th and 11th transistors M10 and M11 are turned on because of the first clock Φ1 of the high logic level. Hence, the 10th and 11th transistors M10 and M11 sense current amplified by the pair of differential input transistors M8 and M9 to generate a set input signal "S" and a reset input signal "R" of the S-R latch circuit SR. When both the SR input signals of the S-R latch circuit SR are at a low logic level, the S-R latch circuit SR remains in a previous output state. When S=0 and R=1 in the S-R latch circuit SR, the S-R latch circuit SR outputs Q output (OUT1)=0 and Q bar output (OUT2)=1. When S=1 and R=0 in the S-R latch circuit SR, the S-R latch circuit SR outputs Q output (OUT1)=1 and Q bar output (OUT2)=0.

Figure 14:
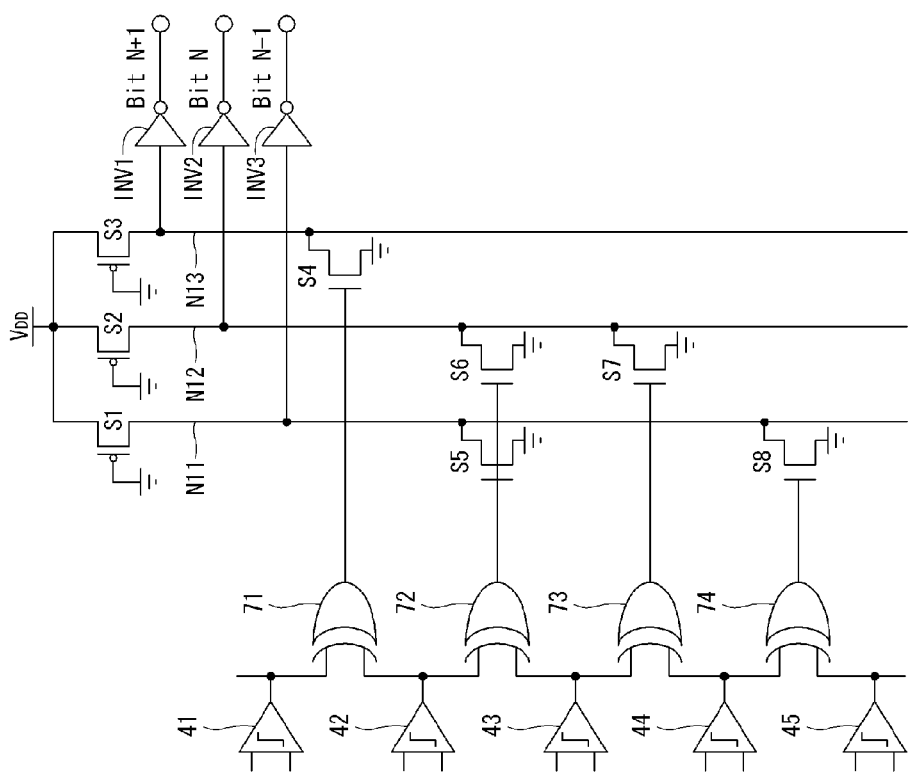
FIG. 14 is a circuit diagram illustrating in detail a portion of an encoding unit.
Figure 15:
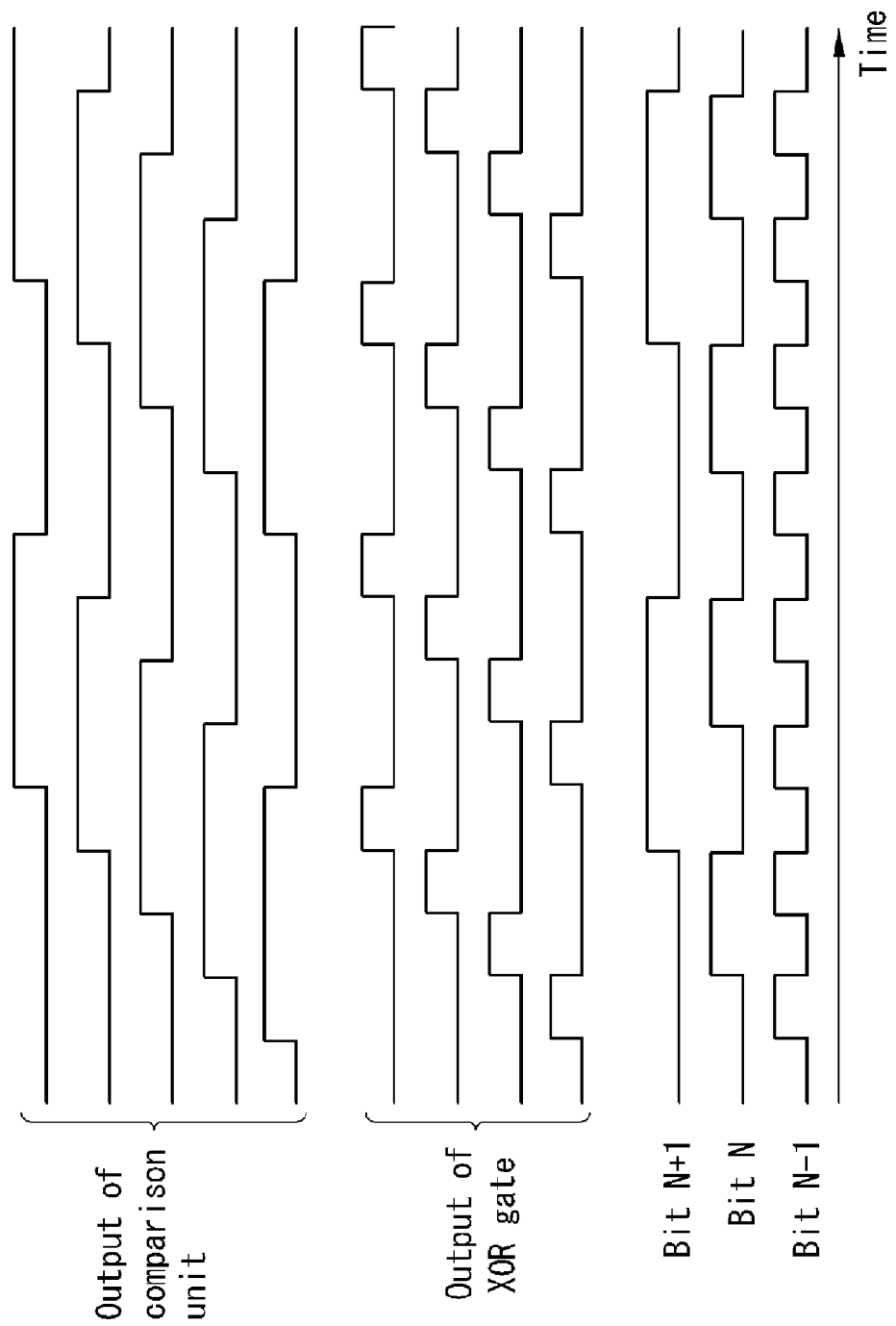
FIG. 15 is a waveform diagram illustrating input and output waveforms of an encoding unit.

FIG. 14 is a circuit diagram illustrating in detail a portion of the encoding unit 150 shown in FIG. 4. FIG. 15 is a waveform diagram illustrating input and output waveforms of the encoding unit 150 shown in FIG. 14.

As shown in FIGS. 14 and 15, the encoding unit 150 may include exclusive OR (XOR) gates 71 to 74 and gray encoders S1 to S8 and INV1 to INV3.

Each of the XOR gates 71 to 74 performs an XOR operation on Q output signals OUT1 of two adjacent comparison amplifiers of comparison amplifiers 41 to 45 to output an operation result. The gray encoders S1 to S8 and INV1 to INV3 include 1st to 8th transistors S1 to S8 and inverters INV1 to INV3. The 1st to 3rd transistors S1 to S3 respectively supply the high potential power voltage VDD to first to third nodes N11 to N13. The 1st to 3rd transistors S1 to S3 are implemented as a p-type MOSFET. The 4th transistor S4 discharges a voltage of the third node N13 in response to a high logic output of the first XOR gate 71 to convert a binary output Bit (N+1) output through the first inverter INV1 into a high logic level, where N is a positive integer. The 6th and 7th transistors S6 and S7 discharge a voltage of the second node N12 in response to a high logic output of each of the second and third XOR gates 72 and 73 to convert a binary output Bit N output through the second inverter INV2 into a high logic level. The 5th and 8th transistors S5 and S8 discharge a voltage of the first node N11 in response to a high logic output of each of the second and fourth XOR gates 72 and 74 to convert a binary output Bit (N−1) output through the third inverter INV3 into a high logic level. When the outputs of the XOR gates 71 to 74 are at a low logic level, voltage levels of the nodes N11 to N13 are converted into a high logic level. Hence, the binary outputs Bit N+1, N, and N−1 are converted into a low logic level.

As described above, the folding ADC 100 according to the embodiment of the invention inputs the analog input signal Vin to the low power analog pre-processing unit 130. The low power analog pre-processing unit 130 compares the analog input single Vin with the reference voltage Vri. Only the folding units of the low power analog pre-processing unit 130, in which the voltage level of the analog input signal Vin is equal to or greater than the reference voltage Vri, operate in an operation mode to input the folding signal forming the zero crossings to the comparison unit 140. The comparison unit 140 compares the pair of differential outputs received from the low power analog pre-processing unit 130 to output the digital signal. The encoding unit 150 converts the digital signal received from the comparison unit 140 into the binary code.

A folding and interpolating analog-to-digital converter (ADC) according to another embodiment of the invention using the above-described current trigger type folding circuit is described with reference to FIG. 16.

Figure 16:
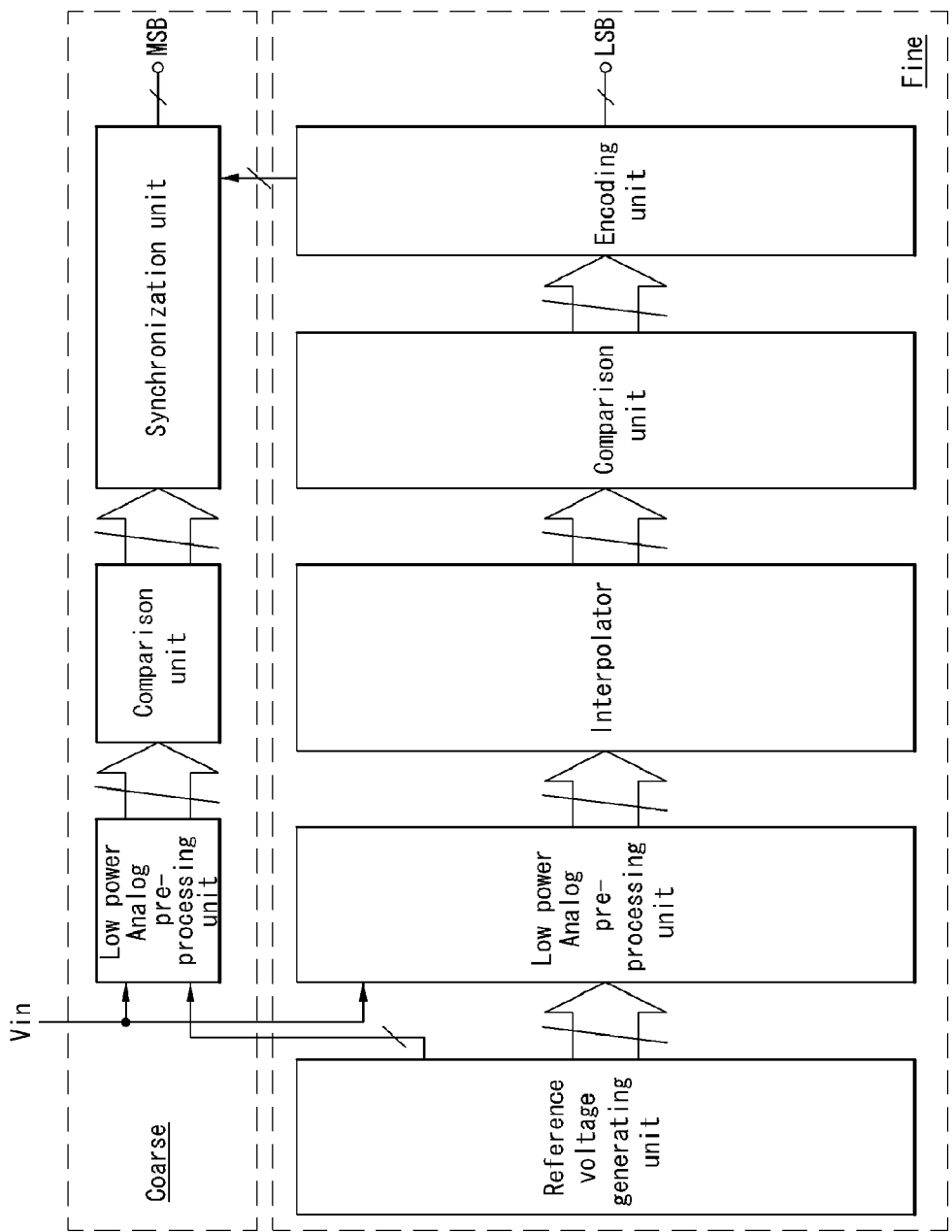
FIG. 16 is a block diagram illustrating a folding and interpolating analog-to-digital converter according to an embodiment of the invention.

As shown in FIG. 16, the folding and interpolating ADC according to the embodiment of the invention includes a coarse converter and a fine converter.

The coarse converter includes a low power analog pre-processing unit, a comparison unit, and a synchronization unit. The low power analog pre-processing unit of the coarse converter receives a reference voltage from a reference voltage generating unit of the fine converter and receives a portion of an analog input signal Vin to output coarse bit or most significant bit MSB. When the most significant bit MSB output by the low power analog pre-processing unit of the coarse converter is m-bit, $2^m$ reference voltages among $2^n$ reference voltages generated by the reference voltage generating unit of the fine converter are necessary in the low power analog pre-processing unit of the coarse converter, where m is a positive integer less than n.

The low power analog pre-processing unit of the coarse converter has substantially the same circuit configuration as FIGS. 6 to 8, and thus compares the analog input single Vin with the reference voltage to generate a pair of differential outputs. The comparison unit of the coarse converter has substantially the same circuit configuration as a comparison unit of the fine converter, and thus receives the pair of differential outputs from the low power analog pre-processing unit of the coarse converter to generate a digital output. The output of the coarse converter is not immediately encoded to the most significant bit MSB and is simultaneously encoded to the most significant bit MSB and the least significant bit LSB output from the fine converter by the synchronization unit of the coarse converter. The synchronization unit of the coarse converter receives output signals of an encoding unit of the fine converter and selects output signals of the comparison unit of the coarse converter to encode the most significant bit MSB. The synchronization unit of the coarse converter performs an error connection for correcting offset voltages of the coarse converter and the fine converter and a time difference between outputs of the coarse converter and the fine converter.

The fine converter includes a reference voltage generation unit, a low power analog pre-processing unit, an interpolator, a comparison unit, and an encoding unit. Since circuit configurations of the reference voltage generation unit, the low power analog pre-processing unit, the comparison unit, and the encoding unit of the fine converter are substantially the same as FIGS. 4 to 15, a further description may be briefly made or may be entirely omitted.

Figure 17:
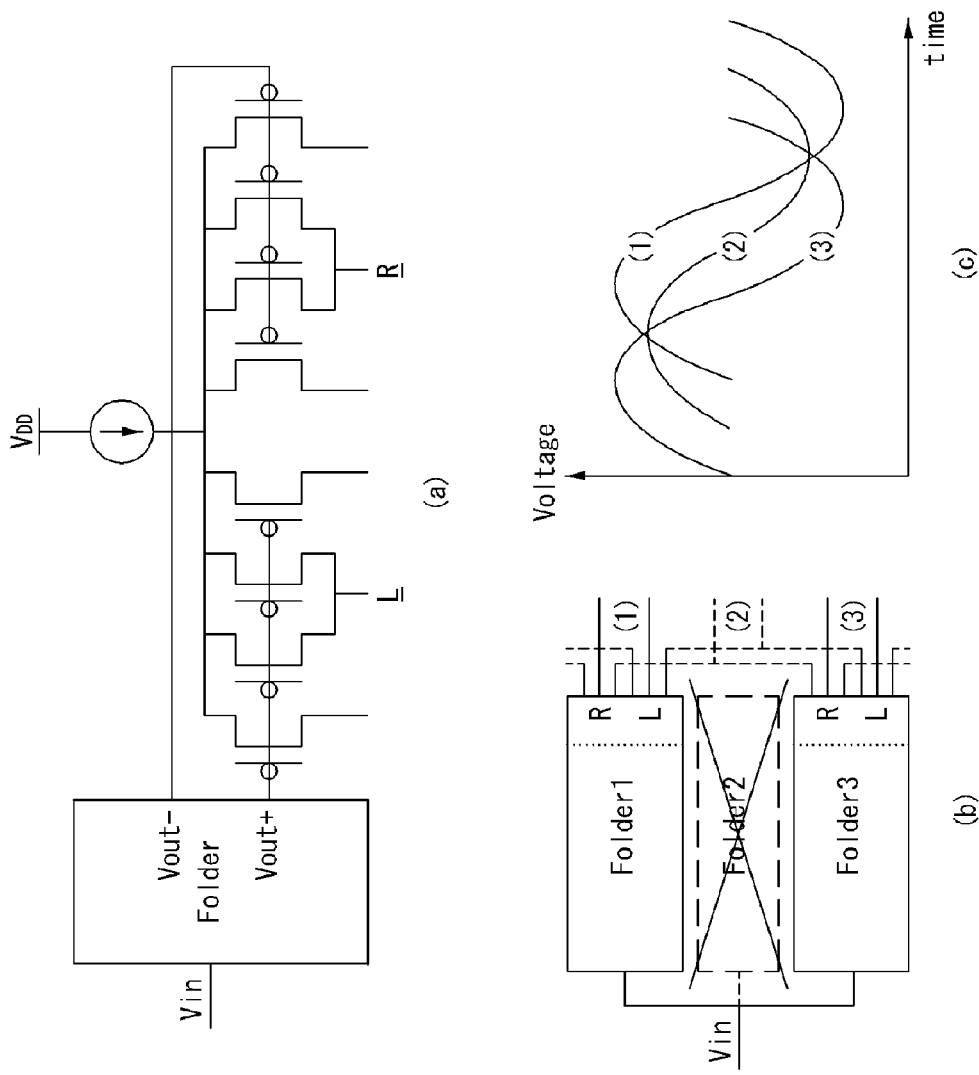
FIG. 17 illustrates an interpolator circuit and input and output waveforms.

The interpolator of the fine converter, as shown in FIG. 17, can reduce the number of folders required in the low power analog pre-processing unit of the fine converter, and thus can have a low input capacitance and can further reduce the chip size and the power consumption. Further, the interpolator of the fine converter can reduce the number of reference voltage input to the low power analog pre-processing unit of the fine converter. For example, the interpolator having an interpolation ratio of 2 may reduce the number of folders to ½ and may reduce the number of resistors of the reference voltage generating unit shown in FIGS. 4 and 5 to $2^{(n-1)}$. Other interpolation ratios may be used. For example, an integer equal to or greater than 2 may be used as the interpolation ratio. The interpolator having an interpolation ratio greater than 2 may further reduce the number of folders and the number of resistors.

The interpolator of the fine converter, as shown in FIG. 17, is implemented by a current divider. In current interpolation, a difference between the analog input signal Vin and the reference voltage is represented by a current difference, and the current difference is output to the current divider. An output signal of the interpolator is applied to the comparison unit.

Figure 18:
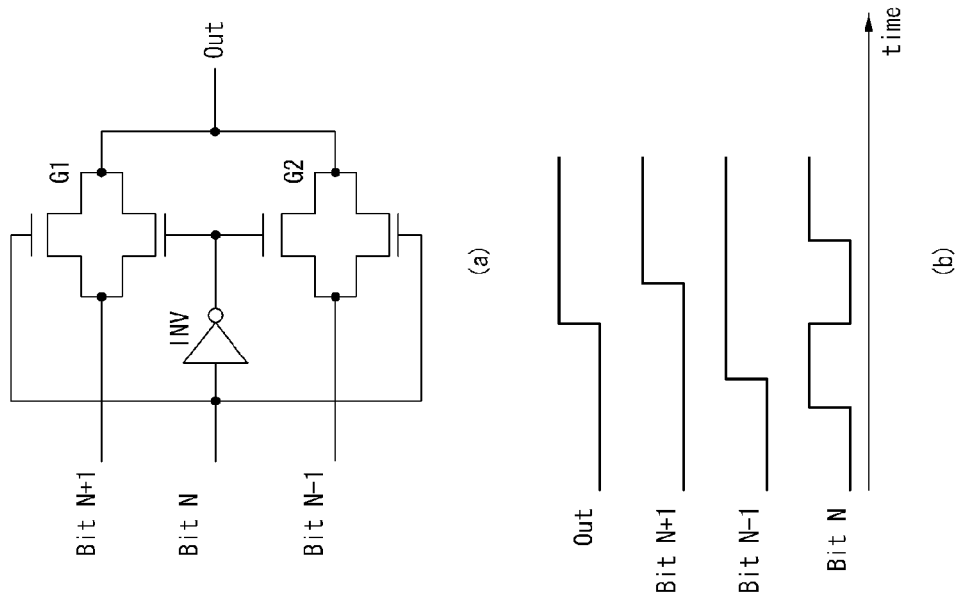
FIG. 18 illustrates a circuit configuration of a synchronization unit and input and output waveforms.

In FIG. 17, (a) illustrates the interpolator implemented by the current divider. The current divider divides an output current of the low power analog pre-processing unit by 4 to generate a division current having a quarter of the output current in each of left and right sides "L" and "R" as shown in (b) and (c) of FIG. 17. Hence, two adjacent division currents each having a quarter of the output current are added to produce a new reference voltage. In (b) of FIG. 17, Folder 2 marked by "X" indicates a folder removed when the current interpolation is applied. The interpolator shown in FIG. 16 may be omitted Because the folding and interpolating ADC simultaneously generates the most significant bit MSB and the least significant bit LSB in parallel, the most significant bit MSB and the least significant bit LSB may be not correctly aligned because of an input offset voltage difference between the low power analog pre-processing unit and the interpolator, an input offset voltage difference of the comparison unit, a time difference between two paths, etc. Hence, a glitch may occur. The synchronization unit is used to remove the glitch. As shown in FIG. 18, the synchronization unit includes two transmission gates G1 and G2 and one inverter INV. The synchronization unit selectively outputs a digital output "Out" of the most significant bit MSB according to the binary outputs Bit(N+1), Bit N, and Bit(N−1) of the least significant bit LSB to thereby perform a synchronization operation.

As described above, the folding ADC according to the embodiment of the invention compares the analog input signal with the reference voltage to convert the current sources of the low power analog pre-processing unit into the operation mode or the sleep mode according to a comparison result. Hence, the power consumption can be greatly reduced.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A folding analog-to-digital converter comprising:
a reference voltage generating unit that generates a plurality of reference voltages;
a low power analog pre-processing unit including a plurality of folders, each of which compares a voltage level of an analog input signal with a corresponding reference voltage of the plurality of reference voltages to generate a pair of differential folded outputs;
a comparison unit that compares outputs of the low power analog pre-processing unit to output a digital signal; and
an encoding unit that converts an output of the comparison unit into a binary code signal,
wherein each of the plurality of folders of the low power analog pre-processing unit includes a plurality of folding units, each of which compares the voltage level of the analog input signal with a corresponding reference voltage of the plurality of reference voltages,
wherein the plurality of folding units are cascade-connected to one another,
wherein when one of the plurality of folding units receives an output of a previous folding unit of the one folding unit, a current source of the one folding unit is driven so that a current source of a next folding unit of the one folding unit is driven in an operation mode,
wherein when the voltage level of the analog input signal is less than the reference voltage, the current source of the one folding unit is driven so that the current source of the next folding unit is converted into a sleep mode.

2. The folding analog-to-digital converter of claim 1, wherein each of the plurality of folders includes a reference current source and a pair of reference differential transistors that are connected to the reference current source and output a pair of differential signals,
wherein the plurality of folding units are cascade-connected to the pair of reference differential transistors and generate the pair of differential folded outputs.

3. The folding analog-to-digital converter of claim 2, wherein when the voltage level of the analog input signal is less than the reference voltage, a current source of an i-th folding unit reduces an output current of the i-th folding unit and allows current sources of folding units in stages equal to or greater than an (i+1)th folding unit to be converted into a sleep mode, where i is a positive integer,
wherein each of the folding units in the sleep mode does not generate an output.

4. The folding analog-to-digital converter of claim 3, wherein when the voltage level of the analog input signal is equal to or greater than the reference voltage, the current source of the i-th folding unit increases an output current of the i-th folding unit and allows the current source of the (i+1)th folding unit to be driven in an operation mode,
wherein each of the folding units in the operation mode generates an output for driving a current source of a next folding unit.

5. The folding analog-to-digital converter of claim 3, wherein the i-th folding unit includes:
an Zi input terminal connected to an Y(i−1) output terminal of an (i−1)th folding unit and one of the pair of reference differential transistors;
an Xi output terminal connected to a load of an output terminal of the i-th folding unit;
an Yi output terminal connected to an Z(i+1) input terminal of the (i+1)th folding unit;
a reference voltage input terminal receiving the reference voltage; and
an analog voltage input terminal receiving the analog input signal.

6. The folding analog-to-digital converter of claim 5, wherein the i-th folding unit further includes:
a current source that is driven according to a current supplied to the Zi input terminal; and
a pair of differential transistors connected to the current source.

7. The folding analog-to-digital converter of claim 6, wherein the current source of the i-th folding unit includes two current mirror circuits connected between the Zi input terminal and the pair of differential transistors.

8. A folding analog-to-digital converter comprising:
a coarse converter for converting an analog input signal into most significant bit; and
a fine converter for converting the analog input signal into least significant bit, the fine converter including:
a reference voltage generating unit that generates a plurality of reference voltages;
a low power analog pre-processing unit including a plurality of folders, each of which compares a voltage level of the analog input signal with a corresponding reference voltage of the plurality of reference voltages to generate a pair of differential folded outputs;
a comparison unit that compares outputs of the low power analog pre-processing unit to output a digital signal; and
an encoding unit that converts an output of the comparison unit into a binary code signal,
wherein each of the plurality of folders of the low power analog pre-processing unit includes a plurality of folding units, each of which compares the voltage level of the analog input signal with a corresponding reference voltage of the plurality of reference voltages,
wherein the plurality of folding units are cascade-connected to one another,
wherein when one of the plurality of folding units receives an output of a previous folding unit of the one folding unit, a current source of the one folding unit is driven so that a current source of a next folding unit of the one folding unit is driven in an operation mode,
wherein when the voltage level of the analog input signal is less than the reference voltage, the current source of the one folding unit is driven so that the current source of the next folding unit is converted into a sleep mode.

9. The folding analog-to-digital converter of claim 8, wherein each of the plurality of folders includes a reference current source and a pair of reference differential transistors that are connected to the reference current source and output a pair of differential signals,
wherein the plurality of folding units are cascade-connected to the pair of reference differential transistors and generate the pair of differential folded outputs.

10. The folding analog-to-digital converter of claim 9, wherein when the voltage level of the analog input signal is less than the reference voltage, a current source of an i-th folding unit reduces an output current of the i-th folding unit and allows current sources of folding units in stages equal to or greater than an (i+1)th folding unit to be converted into a sleep mode, where i is a positive integer,
wherein each of the folding units in the sleep mode does not generate an output.

11. The folding analog-to-digital converter of claim 10, wherein when the voltage level of the analog input signal is equal to or greater than the reference voltage, the current source of the i-th folding unit increases an output current of the i-th folding unit and allows the current source of the (i+1)th folding unit to be driven in an operation mode,
wherein each of the folding units in the operation mode generates an output for driving a current source of a next folding unit.

12. The folding analog-to-digital converter of claim 10, wherein the i-th folding unit includes:
an Zi input terminal connected to an Y(i−1) output terminal of an (i−1)th folding unit and one of the pair of reference differential transistors;
an Xi output terminal connected to a load of an output terminal of the i-th folding unit;
an Yi output terminal connected to an Z(i+1) input terminal of the (i+1)th folding unit;
a reference voltage input terminal receiving the reference voltage; and
an analog voltage input terminal receiving the analog input signal.

13. The folding analog-to-digital converter of claim 12, wherein the i-th folding unit further includes:
a current source that is driven according to a current supplied to the Zi input terminal; and
a pair of differential transistors connected to the current source.

14. The folding analog-to-digital converter of claim 13, wherein the current source of the i-th folding unit includes two current mirror circuits connected between the Zi input terminal and the pair of differential transistors.

15. The folding analog-to-digital converter of claim 8, wherein the fine converter further includes an interpolator that divides an output current of the low power analog pre-processing unit by 4 using a current divider connected between the low power analog pre-processing unit and the comparison unit to obtain a plurality of division currents each having a quarter of the output current, adds two adjacent division currents of the plurality of division currents to generate the reference voltage, and supplies the reference voltage to the comparison unit.

16. The folding analog-to-digital converter of claim 8, wherein the coarse converter includes:
a low power analog pre-processing unit including a plurality of folders, each of which compares the voltage level of the analog input signal with a second reference voltage received from the reference voltage generating unit of the fine converter to generate a pair of differential folded outputs;
a comparison unit that compares outputs of the low power analog pre-processing unit to output a digital signal; and
a synchronization unit that selects an output of the comparison unit depending on the least significant bit received from the fine converter to output the most significant bit,
wherein each of the plurality of folders of the low power analog pre-processing unit includes a plurality of folding units, each of which compares the voltage level of the analog input signal with the second reference voltage,
wherein the plurality of folding units are cascade-connected to one another,
wherein when one of the plurality of folding units receives an output of a previous folding unit of the one folding unit, a current source of the one folding unit is driven so that a current source of a next folding unit of the one folding unit is driven in an operation mode,
wherein when the voltage level of the analog input signal is less than the reference voltage, the current source of the one folding unit is driven so that the current source of the next folding unit is converted into a sleep mode.

* * * * *